United States Patent
Amano et al.

(10) Patent No.: US 10,869,421 B2
(45) Date of Patent: Dec. 15, 2020

(54) MOUNTING DEVICE AND IMAGING PROCESSING METHOD

(71) Applicant: FUJI CORPORATION, Chiryu (JP)

(72) Inventors: Masafumi Amano, Okazaki (JP); Kazuya Kotani, Toyota (JP); Ryohei Kamio, Okazaki (JP); Yusuke Yamakage, Anjo (JP)

(73) Assignee: FUJI CORPORATION, Chiryu (JP)

( * ) Notice: Subject to any disclaimer, the term of this patent is extended or adjusted under 35 U.S.C. 154(b) by 20 days.

(21) Appl. No.: 16/070,845

(22) PCT Filed: Jan. 19, 2016

(86) PCT No.: PCT/JP2016/051394
§ 371 (c)(1),
(2) Date: Jul. 18, 2018

(87) PCT Pub. No.: WO2017/126025
PCT Pub. Date: Jul. 27, 2017

(65) Prior Publication Data
US 2019/0029153 A1    Jan. 24, 2019

(51) Int. Cl.
*H05K 13/08*    (2006.01)
*G01B 11/00*    (2006.01)
(Continued)

(52) U.S. Cl.
CPC ......... *H05K 13/0812* (2018.08); *G01B 11/00* (2013.01); *G01B 11/16* (2013.01);
(Continued)

(58) Field of Classification Search
CPC . A61N 5/1045; A61N 5/1067; H05K 13/0061
(Continued)

(56) References Cited

U.S. PATENT DOCUMENTS

2014/0276005 A1*  9/2014  Forsyth ............... A61B 5/0071
                                                    600/424
2015/0009524 A1*  1/2015  Fujimoto ........... B41F 33/0027
                                                    358/1.14
(Continued)

FOREIGN PATENT DOCUMENTS

WO    WO 2015/019487 A1    2/2015
WO    WO2015/049723 A1    4/2015
WO    WO 2015/083220 A1    6/2015

OTHER PUBLICATIONS

International Search Report dated Apr. 26, 2016 in PCT/JP2016/051394 filed Jan. 19, 2016.

*Primary Examiner* — Kiet M Doan
(74) *Attorney, Agent, or Firm* — Oblon, McClelland, Maier & Neustadt, L.L.P.

(57) ABSTRACT

A mounting device sets a processing region for super-resolution processing based on an approximate position of a main body portion of a component included in a mark image for use in obtaining a position of a fiducial mark and then performs super-resolution processing. Thus, the processing region for super-resolution processing can be appropriately set and prevented from becoming larger than necessary with respect to the main body portion of the component. Further, the processing region for super-resolution processing is determined using the mark image captured under an imaging condition different from that for the component image for use in super-resolution processing. Thus, the processing region can be appropriately set while the component image is kept under an imaging condition suitable for super-resolution processing. Therefore, the processing region for performing super-resolution processing can be set more appropriately, and the super-resolution processing can be efficiently performed.

9 Claims, 9 Drawing Sheets

(51) Int. Cl.
*G06T 3/40* (2006.01)
*G01B 11/16* (2006.01)

(52) U.S. Cl.
CPC .............. *G06T 3/40* (2013.01); *G06T 3/4053* (2013.01); *H05K 13/0813* (2018.08)

(58) Field of Classification Search
USPC ............... 382/141, 128, 299, 199, 173, 155; 414/752.1, 225.01; 29/739
See application file for complete search history.

(56) References Cited

U.S. PATENT DOCUMENTS

| | | | |
|---|---|---|---|
| 2015/0262368 A1* | 9/2015 | Irie | G06K 9/00228 382/173 |
| 2016/0078600 A1* | 3/2016 | Perez Pellitero | G06T 3/4053 382/155 |
| 2016/0192553 A1 | 6/2016 | Kawaguchi | |
| 2016/0309630 A1 | 10/2016 | Amano et al. | |
| 2018/0206370 A1* | 7/2018 | Takama | H05K 13/0452 |

\* cited by examiner

MOUNTING DEVICE AND IMAGING PROCESSING METHOD

TECHNICAL FIELD

The present application relates to a mounting device and an imaging processing method.

BACKGROUND ART

A device has been previously proposed (for example, refer to Patent Literature 1) that generates a super resolution image, having a higher resolution than an image captured of an electronic component, for the purpose of accurately obtaining a holding state, such as a position and an angle of the held electronic component, in a mounting device in which held electronic component is moved and mounted on a board. In this mounting device, a processing region, having a predetermined margin with respect to an outline of the electronic component, is set and predetermined super-resolution processing is performed on the processing region to generate the super resolution image.

CITATION LIST

Patent Literature

Patent Literature 1: WO/2015/049723

BRIEF SUMMARY

Technical Problem

In such super-resolution processing, it is necessary to provide a sufficient predetermined margin so that the electronic component is included in the processing region even when the electronic component is held in a state that is deviated from a normal position or angle. However, if the processing region is set with such a margin, super-resolution processing is also performed for areas not necessary for obtaining the position or angle of the electronic component, thereby making the processing time longer than necessary.

It is a main object of the present disclosure to perform super-resolution processing efficiently by more appropriately setting the processing region subjected to super-resolution processing.

Solution to Problem

A mounting device which obtains a holding state of an electronic component by super-resolution processing in which a high-resolution image of the electronic component is generated using multiple low-resolution images based on a fiducial mark, and mounts the electronic component on a board, the mounting device comprising: a head having the fiducial mark and a holding member holding the electronic component; an imaging device of which imaging range covers the electronic component held by the holding member, and the fiducial mark. The mounting device has a control device that controls the imaging device in such a manner that a mark image for use in obtaining a position of the fiducial mark and low-resolution images for use in the super-resolution processing are captured under different imaging conditions, and the control device sets a processing region as a target of the super-resolution processing based on an image region of the electronic component included in the mark image.

The mounting device of the present disclosure captures, under different imaging conditions, the mark image for use in obtaining the position of the fiducial mark and the low-resolution images for use in super-resolution processing. Further, the mounting device sets the processing region as a target of super-resolution processing based on the image region of the electronic component included in the mark image, and performs super-resolution processing on the processing region in the low-resolution images. As a result, the processing region as a target of the super-resolution processing does not become larger than necessary with respect to the electronic component, and the processing region can be appropriately set. Further, the processing region is determined using the mark image captured under an imaging condition different from that for the low-resolution images for use in the super-resolution processing. Thus, the processing region can be appropriately set while the low-resolution images are kept under an imaging condition suitable for the super-resolution processing. Therefore, the processing region for performing the super-resolution processing can be set more appropriately, and the super-resolution processing can be efficiently performed to achieve high-speed processing.

In the mounting device of the present disclosure, the holding state including the precise position of the electronic component may be obtained from the high-resolution image by the super-resolution processing, and the control device may obtain the approximate position of the electronic component based on the image region of the electronic component included in the mark image and set the processing region based on the obtained approximate position of the electronic component. In this way, the processing region for the super-resolution processing can be set by a simple process based on the approximate position of the electronic component.

In the mounting device of the present disclosure, the control device may obtain the approximate position of the main body portion as the approximate position of the electronic component and set the processing region based on the obtained approximate position of the main body portion. By doing this, the processing region for the super-resolution processing can be set to a region necessary for the image processing of the main body portion of the electronic component, so that the super-resolution processing can be made more efficient.

In the mounting device of the present disclosure, the control device may obtain component information defining the position of an electrode with respect to the main body portion of the electronic component, derive the approximate position of the electrode based on the obtained component information and the approximate position of the main body portion, and set the processing region based on the derived approximate position of the electrode. By doing this, the processing region for the super-resolution processing can be set to a region necessary for the image processing of the electrode in the electronic component, so that the super-resolution processing can be made more efficient.

In the mounting device of the present disclosure, the control device may control the imaging device in such a manner that the imaging device captures the mark image and low-resolution images for use in the super-resolution processing in this order when the head is positioned at a first position within the imaging range and then captures the mark image and low-resolution images for use in the super-resolution processing when the head is positioned at a second position different from the first position within the imaging range, and the control device sets the processing region using the mark image captured at the first position. When the control device with such features performs parallel processing, the low-resolution images at the first position and the mark image and the low-resolution images at the second position can be captured during the setting of the processing region for the super-resolution processing from the mark image captured at the first position. That is, the setting of the processing region can be performed in parallel with the capturing of the image, so that, even when the processing region is set in apart of the image, the super-resolution processing can be prevented from taking a long time.

The imaging processing method of the present disclosure is an imaging processing method for performing super-resolution processing to generate a high-resolution image of an electronic component using multiple low-resolution images based on a fiducial mark. The imaging processing method includes: capturing, under different imaging conditions, a mark image for use in obtaining a position of the fiducial mark and low-resolution images for use in the super-resolution processing; and setting a processing region as a target of the super-resolution processing based on an image region of the electronic component included in the mark image.

Similarly to the mounting device described above, the imaging processing method of the present disclosure makes it possible to more appropriately set the processing region for the super-resolution processing and to efficiently perform the super-resolution processing.

In the imaging processing method of the present disclosure, the mark image may be captured before the low-resolution images for use in generating the high-resolution image are captured, and the low-resolution images for use in the super-resolution processing may be captured in parallel with the setting of the processing region. In this way, the setting of the processing region can be performed in parallel with the capturing of the image, so that, even when the processing region is set in a part of the image, the super-resolution processing can be prevented from taking a long time.

DESCRIPTION OF EMBODIMENTS

Figure 1:
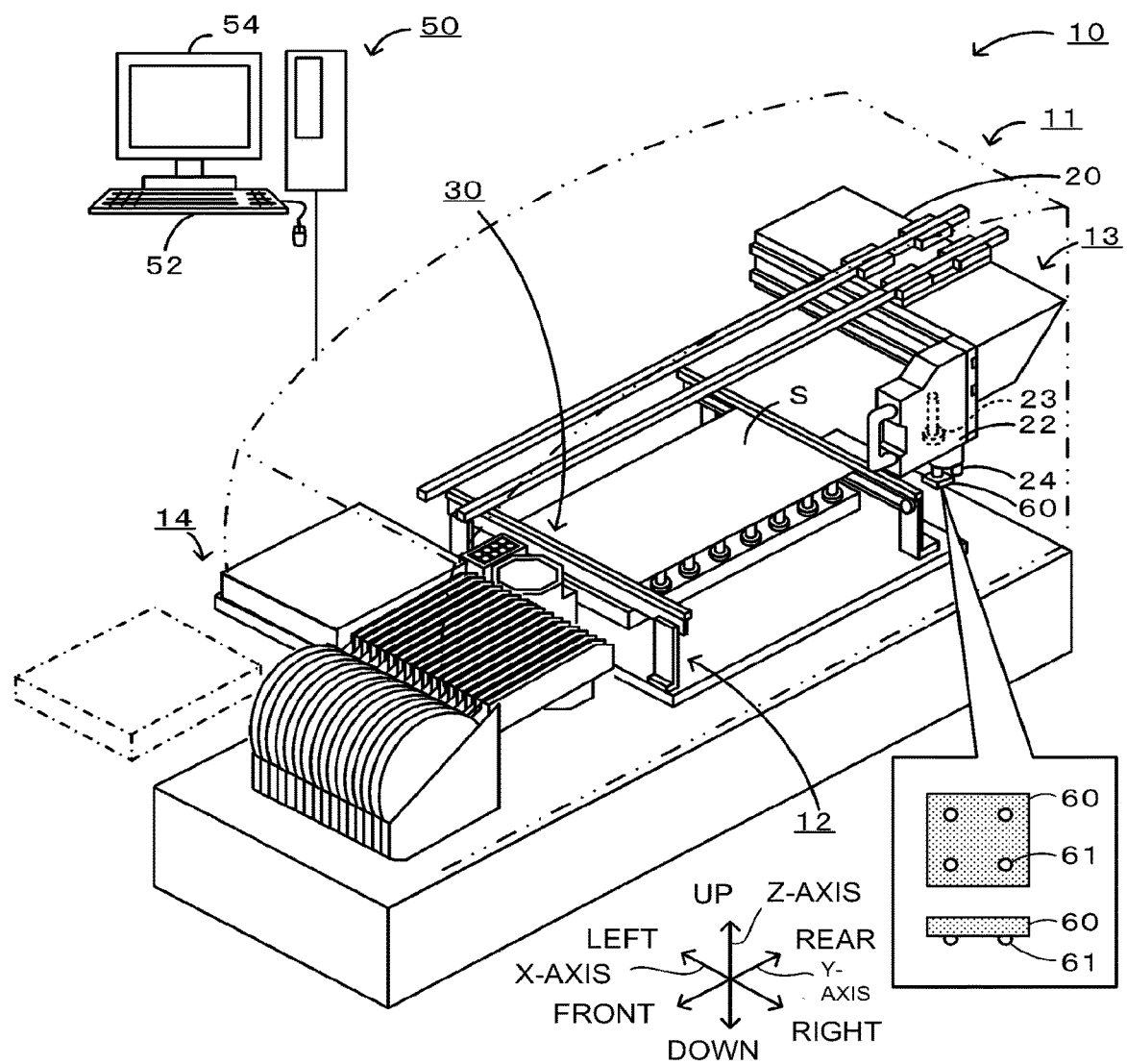
FIG. 1 is a schematic diagram illustrating an example of a mounting system 10.
Figure 2:
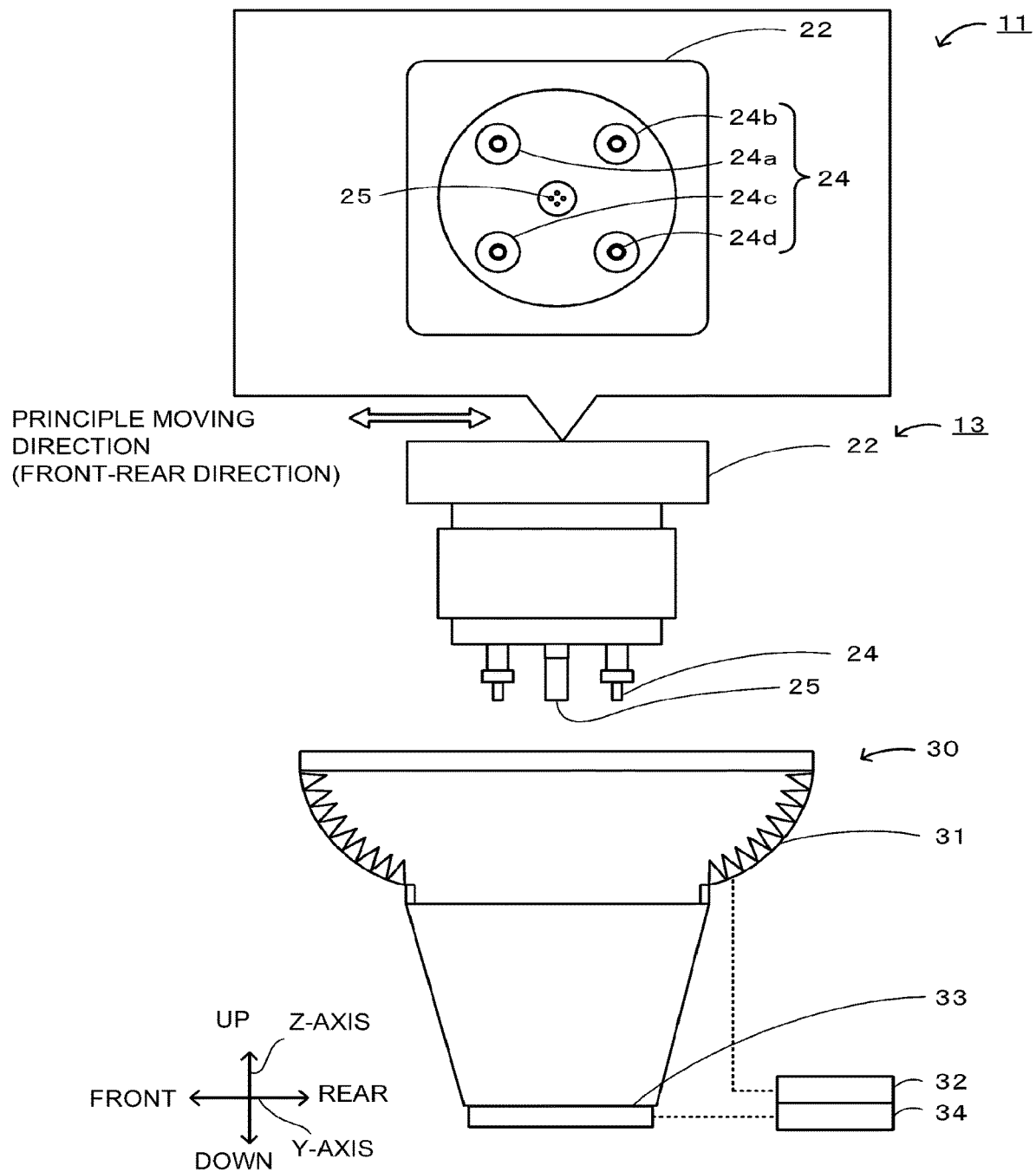
FIG. 2 is an explanatory diagram of a mounting head 22 and an imaging unit 30.
Figure 3:
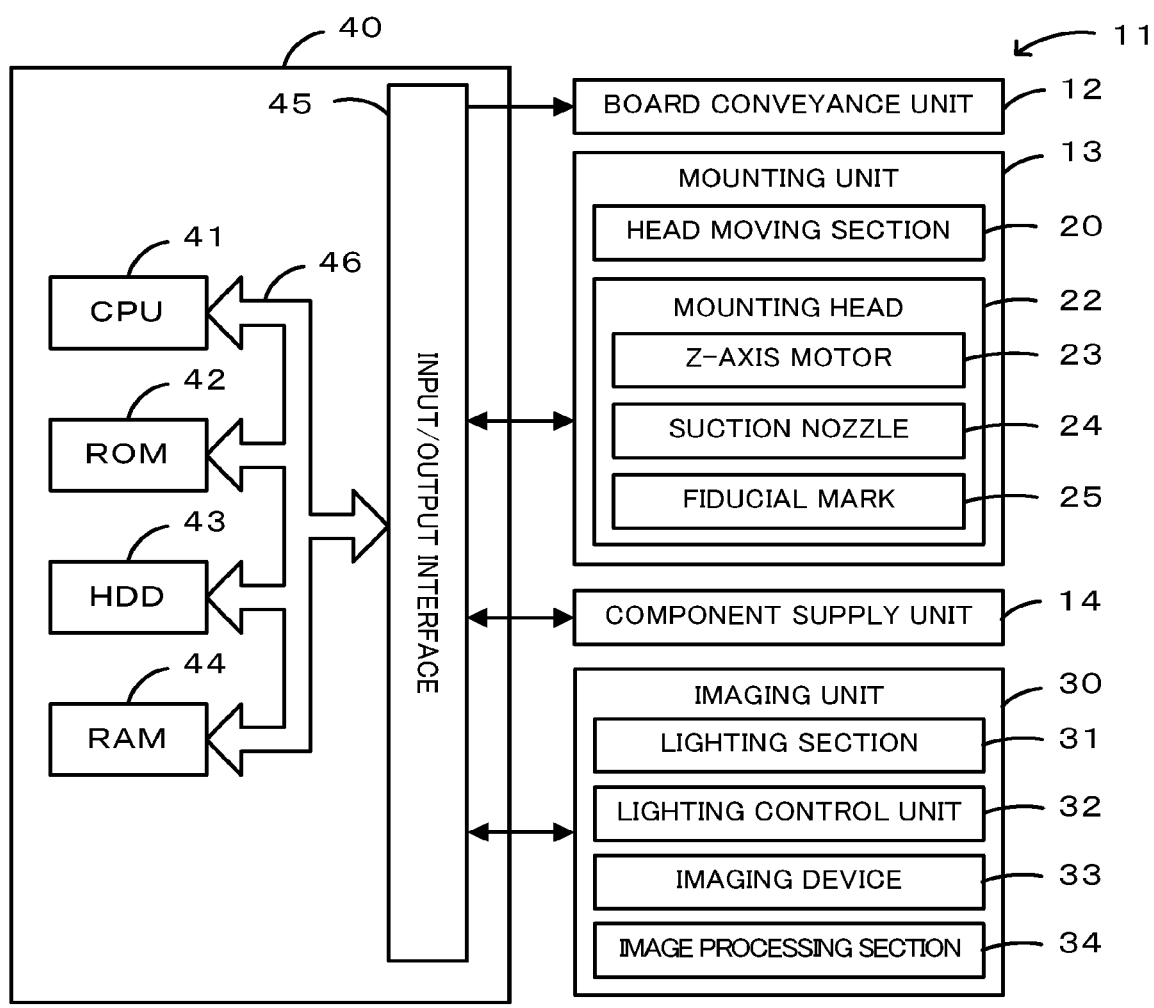
FIG. 3 is a block diagram showing a configuration of a mounting device 11.

Next, an embodiment of the present disclosure will be described with reference to the drawings. FIG. 1 is a schematic explanatory diagram illustrating an example of a mounting system 10. FIG. 2 is an explanatory diagram of amounting head 22 and an imaging unit 30. FIG. 3 is a block diagram showing a configuration of a mounting device 11. The mounting system 10 is, for example, a system that executes a process of mounting a component 60 on a board S. The mounting system 10 includes a mounting device 11 and a management computer (PC) 50. In the mounting system 10, multiple mounting devices 11 for performing mounting processes for mounting electronic components on boards S are arranged from upstream to downstream. In FIG. 1, only one mounting device 11 is shown for convenience of description. Note that the mounting process includes processes such as disposing, mounting, inserting, joining, and bonding of a component on a board. In the present embodiment, the left-right direction (X-axis), the front-rear direction (Y-axis), and the up-down direction (Z-axis) are as shown in FIGS. 1 and 2.

As shown in FIGS. 1 to 3, the mounting device 11 includes a board conveyance unit 12, a mounting unit 13, a component supply unit 14, an imaging unit 30, and a control device 40. The board conveyance unit 12 is a unit for carrying in and transporting the board S, fixing the board S at a mounting position, and carrying out the board S. The board conveyance unit 12 has a pair of conveyor belts which are arranged at intervals in the front-rear direction in FIG. 1 and are stretched in the left-right direction. The board S is conveyed by the conveyor belts.

The mounting unit 13 picks up an electronic component (hereinafter, also referred to as a component 60) from the component supply unit 14 and arranges the electronic component on a board S fixed to the board conveyance unit 12. As shown in FIG. 1, the component 60 is, for example, a BGA component in which multiple hemispherical bumps 61 (i.e., electrodes) are provided on a lower portion of a plate-shaped main body. The component 60 may be a chip component or a lead component. The mounting unit 13 includes a head moving section 20, a mounting head 22, and a suction nozzle 24. The head moving section 20 has a slider that moves in the XY-directions with guided by a guide rail and a motor that drives the slider. The mounting head 22 is detachably attached to the slider and is moved in the XY-directions by the head moving section 20. One or more suction nozzles 24 are removably mounted on the lower face of the mounting head 22. Here, a case in which the mounting head 22 has four suction nozzles 24a-24d installed will be described with reference to FIG. 2. The suction nozzles 24a-24d are collectively referred to as the suction nozzles 24. The suction nozzles 24 hold the component 60 by using negative pressure and are removably attached to the mounting head 22. The mounting head 22 has a built-in Z-axis motor 23. The Z-axis motor 23 adjusts the height of the suction nozzles 24 along the Z-axis. The mounting head 22 includes a rotating device for rotating (i.e., spinning) the suction nozzle 24 with a driving motor (not shown), and is capable of adjusting the angle of the component held (i.e., sucked) by the suction nozzles 24.

As shown in FIG. 2, on the lower face of the mounting head 22, a fiducial mark 25 serving as a reference for the position of the held component is disposed at the center portion within the mounting head 22 circumference. The fiducial mark 25 may also be disposed outside of the mounting head 22 circumference, that is, at a corner of the imaging range of the imaging unit 30. The fiducial mark 25 consists of four circular marks. The center of the fiducial mark 25 is disposed in a predetermined positional relationship with the suction nozzles 24, for example, at a predetermined distance away from the suction nozzles 24. Since the suction nozzles 24a-24d have a predetermined positional relationship (distance and arrangement position) with the fiducial mark 25, the positions of each suction nozzle 24 can be recognized if the position of the fiducial mark 25 is recognized.

The component supply unit 14 is provided with multiple reels and is detachably attached to the front of the mounting device 11. Tape is wound around each reel, and multiple components are held on the surface of the tape along the longitudinal direction of the tape. The tape is unwound backward from the reel and is fed out by a feeder section to a supply position where the tape is drawn in by the suction nozzles 24 such that the components are exposed. The component supply unit 14 includes a tray unit having a tray on which multiple components are arranged and placed. The tray unit includes a moving mechanism that secures the tray to a pallet, draws the tray from a magazine cassette (not shown), and moves the tray to a predetermined supply position. The tray has a number of rectangular cavities which accommodate the components. The components accommodated in the tray are larger in height and size than the components accommodated in the reel. The component 60 is housed in a tray of the tray unit.

The imaging unit 30 is a unit for capturing an image of a component or a fiducial mark 25 drawn in by the suction nozzles 24 of the mounting head 22. The imaging unit 30 is disposed between the component supply unit 14 and the board conveyance unit 12. The imaging range of the imaging unit 30 is above the imaging unit 30 and includes the component, sucked by the suction nozzles 24, and the fiducial mark 25. The imaging unit 30 includes a lighting section 31, a lighting control section 32, an imaging device 33, and an image processing section 34. The lighting section 31 is configured to irradiate the component 60 held by the mounting head 22 with light in multiple possible lighting states. The lighting section 31 is a light source unit having, for example, lamps disposed at upper, middle, and lower levels and an epi-lamp (not shown) as a light source, and capable of adjusting the brightness (i.e., light amount), the wavelength, the irradiation position, and so on of the light irradiated onto the component held by the suction nozzle 24. The lighting section 31 irradiates light from the side when the upper lamp is lit, irradiates light from the side and lower side when the lower lamp is lit, irradiates light from the lower side when the epi-lamp is lit, and irradiates light so that the entire lamp becomes brighter when all the lamps are lit. The lighting control section 32 puts the lighting section 31 into a lighting state in accordance with the component sucked by the suction nozzle 24 based, on a predetermined lighting condition. The imaging device 33 is an element that generates electrical charges by receiving light and outputs the generated electrical charges. The imaging device 33 may be a CMOS image sensor capable of performing a high-speed sequential capturing process by overlapping charge transfer after exposure and subsequent image exposure processing. The image processing section 34 performs processing for generating image data based on the inputted charges. The imaging unit 30 captures one or more images while the mounting head 22 moves or is in a stopped state and outputs the captured image data to the control device 40 when the suction nozzles 24 sucking the component passes over the imaging unit 30.

As shown in FIG. 3, the control device 40 is configured as a microprocessor with a central CPU 41, and includes a ROM 42 for storing processing programs, an HDD 43 for storing various data, a RAM 44 used as a work region, an input and output interface 45 for exchanging electric signals with external devices, and so on. These are connected via a bus 46. The control device 40 outputs control signals to the board conveyance unit 12, the mounting unit 13, the component supply unit 14, and the imaging unit 30, and receives input signals from the mounting unit 13, the component supply unit 14, and the imaging unit 30.

The management PC 50 is a computer that manages information for each device of the mounting system 10. The management PC 50 is provided with input devices 52, such as a keyboard and a mouse for various pieces of information to be inputted by an operator, and a display 54, for displaying various types of data.

Figure 4:
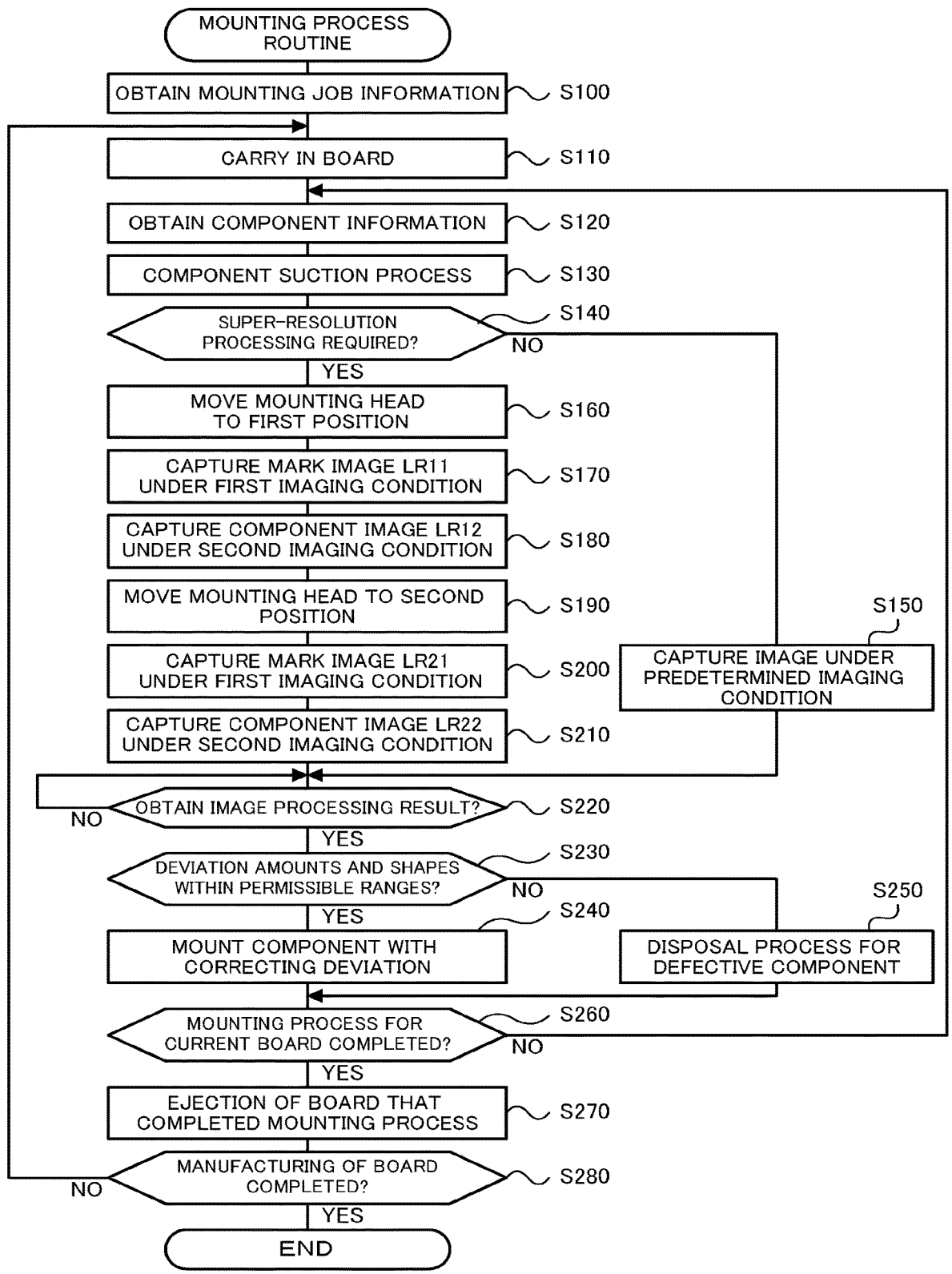
FIG. 4 is a flowchart showing an example of a mounting process routine.

Next, operation of the mounting system 10 of the present embodiment configured as described above, specifically a mounting process of the mounting device 11, will be described. FIG. 4 is a flowchart showing an example of a mounting process routine executed by the CPU 41 of the control device 40. This routine is stored in the HDD 43 of the control device 40, and the routine is executed in response to an instruction to start the routine by the operator. Here, mainly, a case in which the component 60 is sucked to each of the suction nozzles 24a-24d and mounted on the board S will be described. When this routine is started, the CPU 41 of the control device 40 first obtains mounting job information from the management PC 50 (S100). Mounting job information includes component information such as mounting order of components, type of components to be mounted, characteristics of the components, suction nozzle 24 information for sucking the components, and imaging conditions (including lighting conditions) for the imaging unit 30. Characteristics of components include component size information, position and number of bumps 61, size information (i.e., bump diameter) of bumps 61, images of normally shaped components to serve as reference images, and so on.

Next, the CPU 41 carries in the board S (S110), sets the component to be sucked, and obtains component information about the component from the mounting job information (S120). Next, the CPU 41 attaches the suction nozzles 24 to the mounting head 22 as needed and performs a suction process on the set component (S130). In the suction process, the CPU 41 moves the mounting head 22 to the supply position of the component supply unit 14 where the corresponding component is housed, lowers the suction nozzle 24, and sucks the component to the suction nozzle 24. In this suction process, one or more components 60 may be sucked to the suction nozzles 24a-24d.

Next, the CPU 41 determines whether the components require super-resolution processing (S140). This determination is made based on the component information obtained in step S120. Some components to be mounted have different optical characteristics (for example, surface luminance, light reflectance, etc.) and different electrode shapes and positions, and may require a change in light exposure time and lighting at the time of imaging. Under the imaging conditions suited to such components, the fiducial mark 25 may not be clearly imaged. Imaging conditions include, for example, one or more of the lighting position, color Of lighting, light, exposure time, and focal length of the lighting section 31. Further, if the components to be mounted have various sizes and the imaging unit 30 has a visual field range capable of imaging a large component, sufficient resolution may not be obtained when imaging a small component. When such a small component is imaged in the mounting device 11, super-resolution processing is performed to obtain a high-resolution image by fixing positions of multiple low-resolution images using the fiducial mark 25. In S140, the CPU 41 determines whether super-resolution processing is required based on whether the component sucked to the mounting head 22 requires a high-resolution image with a different imaging condition from the fiducial mark 25. Here, in the component 60, since the bumps 61 and the fiducial mark 25 have different appropriate lighting angles, the fiducial mark 25 and the component 60 have different imaging conditions. Further, in order to determine whether the component 60 is normal, the CPU 41 needs to detect defects, deformations, and the like of the relatively small bumps 61. Further, the component 60 having relatively small bumps 61 is a component requiring high mounting accuracy because contact failure occurs due to slight positional deviations when mounting on the board S. Therefore the component 60 having relatively small bumps 61 requires a high-resolution image, and may be a component requiring super-resolution processing.

When the CPU 41 determines that super-resolution processing is not required in S140, the imaging unit 30 captures an image under a predetermined imaging condition (S150). When the component determined not to require super-resolution processing in S140 is a chip component or a lead component, a first imaging condition is used as the predetermined imaging condition. The first imaging condition may be, for example, a condition that can capture the outline of the fiducial mark 25 and the component in a sufficiently clear manner, and set such that all the lamps of the lighting section 31 are turned on and light is irradiated from all directions. In this instance, the CPU 41 may have the imaging unit 30 capture an image of the component while moving the mounting head 22 in S150. In this way, the imaging time can be further shortened compared to the case in which imaging is performed with the mounting head 22 stopped. The CPU 41 performs image processing to obtain positional deviation, shape abnormality, or the like of the components sucked by the suction nozzles 24 by using the captured image. When the component, determined not to require super-resolution processing in S140, is a BGA component having a relatively large size (i.e., bump diameter) and not requiring a high mounting accuracy, the second imaging condition is used as the predetermined imaging condition. The second imaging condition may be, for example, a condition in which the hemispherical bump 61 can be imaged sufficiently clearly, and is set such that the lamp at the upper level of the lighting section 31 is turned on and light is irradiated from the side. In this case, the CPU 41 stops the mounting head 22 and captures an image under the second imaging condition, and performs image processing to obtain the positions of the bumps, abnormal shapes, and the like from the image captured under the second imaging condition. On the other hand, the CPU 41 may have the imaging unit 30 capture an image while moving the mounting head 22 and, in that case, may have the imaging unit 30 capture an image under the first imaging condition and the second imaging condition. The CPU 41 performs image processing for recognizing the position of the fiducial mark 25 from the captured image of the first imaging condition, and performs image processing for obtaining the positions, shape abnormalities, and the like of the bumps from the captured image of the second imaging condition based on the recognized position of the fiducial mark 25.

Figure 5:
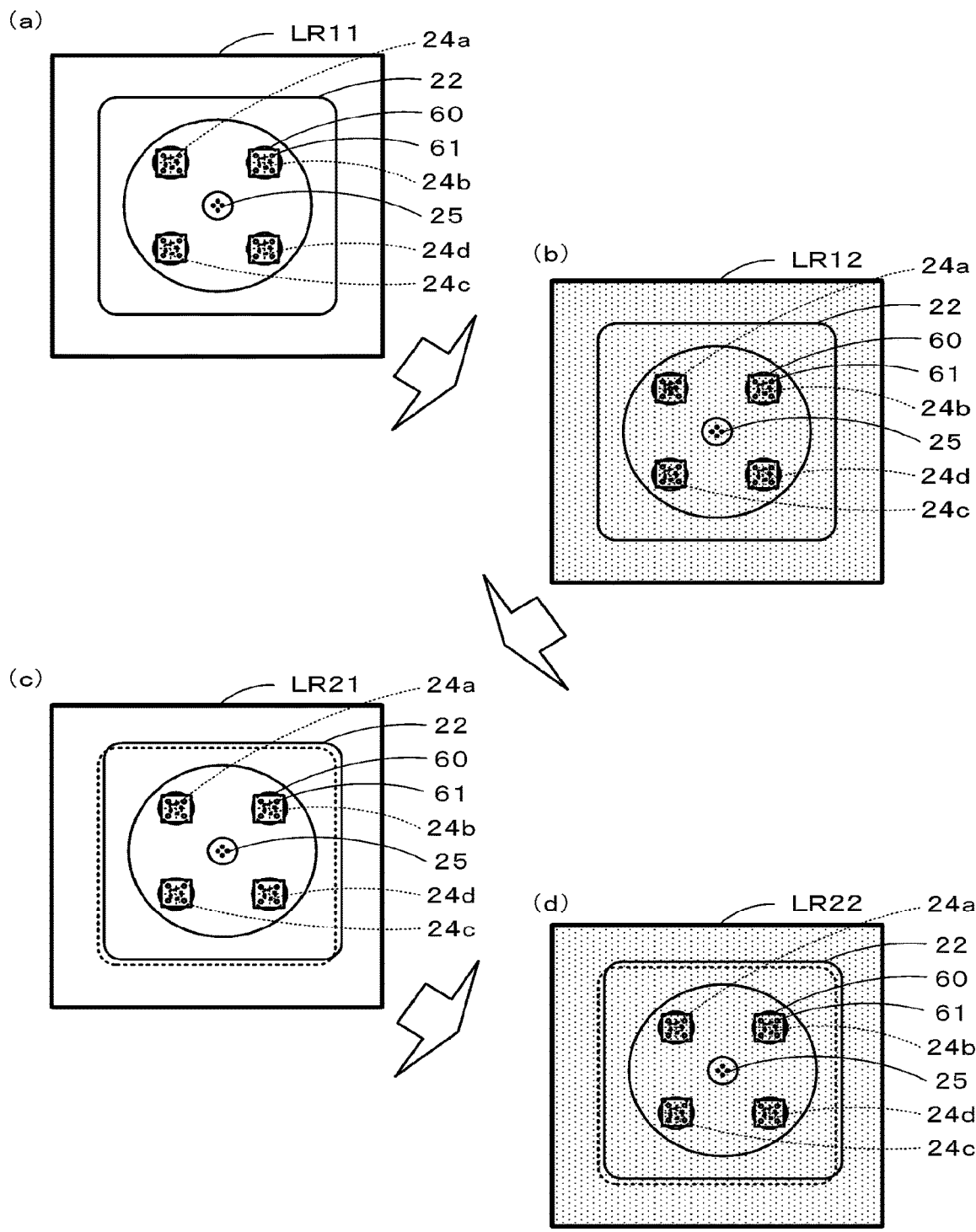
FIG. 5 is an explanatory diagram showing a state of capturing an image required for super-resolution processing.

On the other hand, when the CPU 41 determines that super-resolution processing is required in S140, such as when the component 60 has relatively small bumps 61, the image required for super-resolution processing as described below is captured, and image processing described later is performed in parallel with the image capture. FIG. 5 is an explanatory diagram showing the capturing of an image required for super-resolution processing. In the capturing of an image, the CPU 41 first moves the mounting head 22 to the first position in the imaging region of the imaging unit 30 (S160), and then has the imaging unit 30 capture an image (i.e., mark image LR11) of the fiducial mark 25 under the first imaging condition (S170, FIG. 5A). Subsequently, the CPU 41 has the imaging unit 30 capture an image of the component 60 (i.e., the component image LR12) under the second imaging condition while keeping the mounting head 22 in the first position (S180 FIG. 5B). The first-imaging condition is set as a condition in which the image of the fiducial mark 25 and the outer shape of the component can be captured sufficiently clearly. Further, the second imaging condition is set as a condition in which the image of the hemispherical bump 61 can be captured sufficiently clearly. Therefore, the second imaging condition sets, for example, a condition such that the lamp at the upper level of the lighting section 31 is turned on and light is irradiated from the side, which turns out the image of other portions, other than the bump 61, being hardly captured under the second imaging condition. In this manner, the CPU 41 captures the mark image LR11 and the component image LR12 at the same first position under different imaging conditions.

Figure 6:
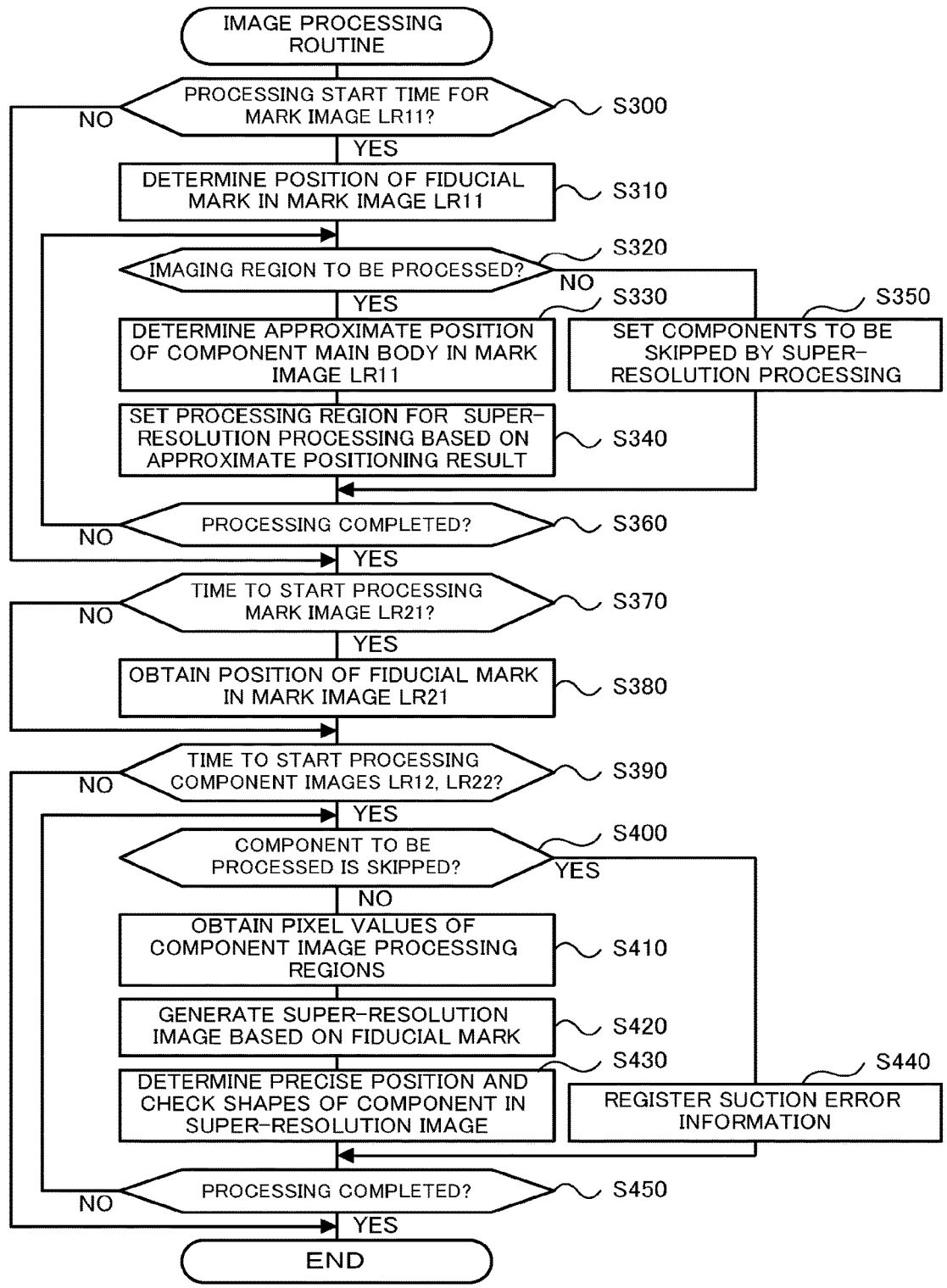
FIG. 6 is a flowchart showing an example of an image processing routine.

Next, the CPU 41 sets the mounting head 22 within the imaging region of the imaging unit 30, and moves the mounting head 22 to a second position that differs from the first position (S190). The second position may be set to a position at which a second image is captured so that multi-frame super-resolution processing can be performed. That is, the second position is shifted by 1/X pixels (where 1<X, for example, X=2) with respect to the first image to be captured at the first position. When the mounting head 22 moves to the second position, the CPU 41 has the imaging unit 30 capture an image (i.e., mark image LR21) of the fiducial mark 25 under the first imaging condition (S200, FIG. 5C) in the same manner as in S170. Subsequently, the CPU 41 has the imaging unit 30 capture an image of the component 60 (i.e., the component image LR22) under the second imaging condition in the same manner as in S180 with the mounting head 22 at the second position (S210, FIG. 5D). In this manner, capturing of images necessary for super-resolution processing is performed. The CPU 41 can determine the relative positions of the fiducial mark 25 and the component 60 at the first position using the mark image LR11, captured at the first position, and the component image LR12. In addition, the CPU 41 can determine the relative positions of the fiducial mark 25 and the component 60 at the second position using the mark image LR21, captured at the second position, and the component image LR22. As described above, the CPU 41 performs image processing in parallel with image capturing. FIG. 6 is a flowchart showing an example image processing routine executed by the CPU 41 of the control device 40.

When this routine is started, the CPU 41 of the control device 40 first determines whether the processing start time is the processing start time of the mark image LR11 (S300). When the mark image LR11 captured in S170 of the mounting process routine of FIG. 4 is inputted from the imaging unit 30, the CPU 41 makes an affirmative determination in S300. When it is determined that processing of the mark image LR11 has started, the CPU 41 performs a positioning process for determining the position of the fiducial mark 25 in the mark image LR11 (S310) and determines whether there is an imaging region of the component to be processed (S320). As described above, since the suction nozzles 24a-24d are in a predetermined positional relationship with the fiducial mark 25, the positions of the components sucked to the suction nozzles 24a-24d can be recognized based on the positions of the fiducial mark 25 obtained by the positioning process. Therefore, in S320, the CPU 41 sets the components sucked to the suction nozzles 24a-24d as processing targets in the order of the suction nozzles 24a-24d, recognizes the positions of the set processing target components from the position of the fiducial mark 25, and determines whether or not there is an image region of the component having a pixel value different from that of the background region at the positions of the processing target components.

If the CPU 41 determines in S320 that there is an image region of the component to be processed, it performs an approximate positioning process for determining the approximate position of the component 60 in the mark image LR11 (S330). In S330, the CPU 41 extracts the image region of the component 60 recognized in S320 from the mark image LR11 and obtains the coordinate of the corner of the main body portion (outer shape) of the extracted component 60 to determine the approximate position of the component 60. For example, if the shape of the main body portion of the component 60 is rectangular, the approximate position of the component 60 is determined by obtaining the coordinates of the four corners. The coordinates may be defined by XY coordinates with the center position of the fiducial mark 25 as a reference. As described above, the mark image LR11 is captured under an imaging condition suitable for detecting the outer shape of the component 60 in addition to detecting the fiducial mark 25. Therefore, the CPU 41 can easily determine the approximate position of the main body portion of the component 60 from the mark image LR11. When the approximate position of the main body portion of the component 60 is determined, the CPU 41 sets a processing region (super resolution region) of the super-resolution processing based on the approximate positioning result (S340). Here, the smallest rectangular region including the corner of the main body portion of the component 60 is set as the processing region based on the coordinates of the corner of the main body portion of the component 60 determined as the approximate position. Alternatively, a region obtained by adding a slight margin, based on detection error, image accuracy, etc., to the smallest rectangular region, including the corner of the main body portion of the component 60, may be set as the processing region. If the CPU 41 determines in S320 that there is no image region of the component to be professed, the CPU 41 concludes that a suction error has occurred in which the component 60 is not sucked to a suction nozzle 24 and sets the component as a target to be skipped in super-resolution processing (S350).

Figure 7:
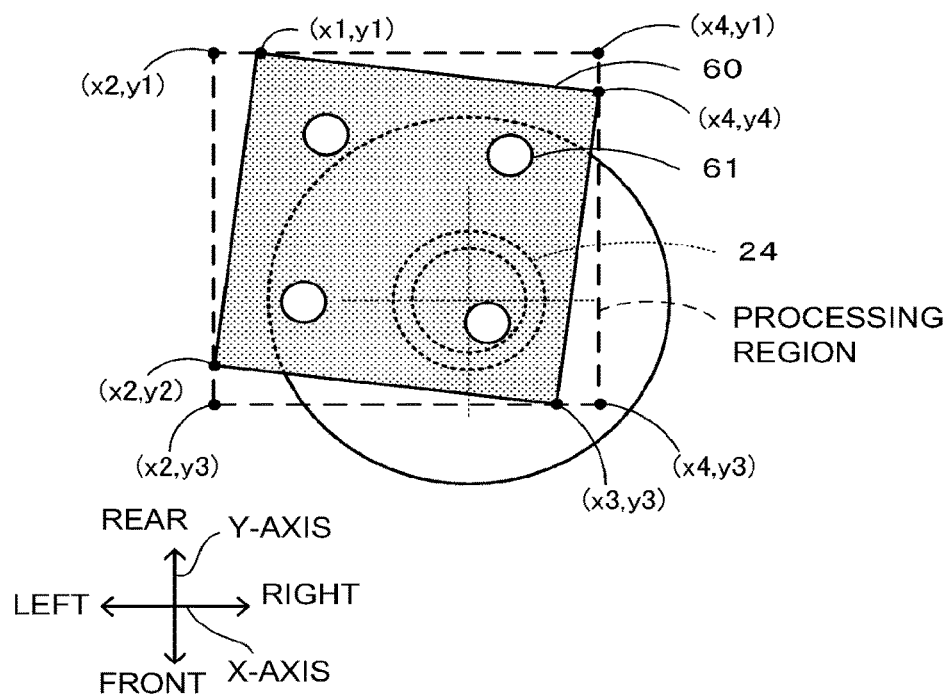
FIG. 7 is an explanatory diagram illustrating a processing region for super-resolution processing according to an embodiment.
Figure 8:
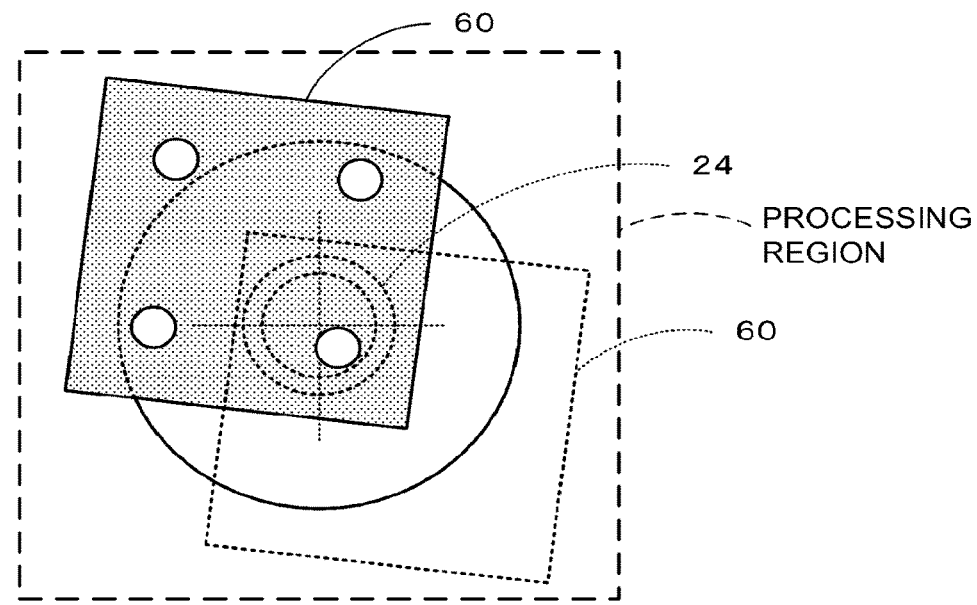
FIG. 8 is an explanatory diagram illustrating a processing region for super-resolution processing of a comparative example.

FIGS. 7 and 8 are explanatory diagrams showing processing regions of super-resolution processing. FIG. 7 is a processing region of the present embodiment, and FIG. 8 is a processing region of a comparative example. In the comparative example, the processing region is not set based on the approximate position of the component 60 but is set to a constant size. In some cases, the component 60 sucked by the suction nozzle 24 is positionally deviated with respect to the suction nozzle 24. Therefore, in the comparative example, as shown in FIG. 8, a relatively large area with respect to the component 60 is set as the processing region for super-resolution processing so that the component 60 is included in the processing area even when the component 60 is positionally deviated to the upper left (solid line), the lower right (dotted line), or the like. Therefore, most of the processing region for super-resolution processing consists of areas unnecessary for super-resolution processing which are not occupied by the component 60. On the other hand, in the present embodiment, the approximate position of the main body portion (outer shape) of the component 60 is determined from the mark image LR11, and the processing region is set based on this approximate position. Therefore, as shown in FIG. 7, based on the coordinates (i.e., (x1, y1), (x2, y2), (x3, y3), (x4, y4)) of the four corners of the main body portion of the component 60, coordinates (for example, (x2, y1), (x2, y3), (x4, y3), (x4, y1)) of four corners of the smallest rectangular region including the four corners of the main body portion are obtained to set the processing region. In this manner, since the processing region for performing super-resolution processing is determined as a relatively small region based on the approximate position of the component 60, it is possible to efficiently perform super-resolution processing by limiting to a region necessary for performing super-resolution processing.

When processing of S340 or S350 is performed, the CPU 41 determines whether or not the processing of each component sucked by the suction nozzles 24 (24a-24d) has been completed (S360), and if it is determined that the processing of each component has not been completed, the process returns to S320 to perform processing of the next component to be processed. If the CPU 41 determines that the processing of each component has completed, the CPU 41 proceeds to the subsequent processing of S370. If it is determined in S300 that processing of the mark image LR11 has not started, the CPU 41 skips processing of S310-S360 and proceeds to processing of S370.

Next, the CPU 41 determines whether or not it is time to start processing of the mark image LR21 (S370). The CPU 41 makes an affirmative determination in S370 when the mark image LR21 captured in S200 of the mounting processing routine of FIG. 4 is inputted from the imaging unit 30 and other images are not subjected to image processing. If the CPU 41 determines that it is time to start processing the mark image LR21, the CPU 41 performs positioning processing to obtain the position of the fiducial mark 25 in the mark image LR21 in the same manner as in S310 (S380). The CPU 41 does not perform the approximate positioning processing of the component 60 or the setting of the processing region for super-resolution processing on the mark image LR21. If the CPU 41 determines in S370 that processing of the mark image LR21 is not started, processing of S380 is skipped.

Subsequently, the CPU 41 determines whether it is time to start processing of the component images LR12, LR22, (S390). When the component images LR12, LR22 captured in S180, S210 of the mounting process routine of FIG. 4 are inputted from the imaging unit 30 and other images are not subjected to image processing, the CPU 41 makes an affirmative determination in S390. If the CPU 41 determines that it is time to start processing of the component images LR21, LR22, the CPU 41 determines whether or not the component to be processed is to be skipped in super-resolution processing (S400). In S400, the CPU 41 sets components to be processed in the order of the suction nozzles 24a-24d and determines whether or not the set components to be processed are set to be skipped in S350.

When determining that the component 60 to be processed is not set to be skipped, the CPU 41 obtains pixel values of the processing region of the component images LR12, LR22 (S410) and performs super-resolution processing for generating the super resolution image SR based on the positions of the fiducial mark 25 using the obtained pixel values (S420). In super-resolution processing, an image of a second resolution (i.e., high resolution), which is higher than a first resolution, is generated using the component image of the first resolution (i.e., low resolution) captured by the imaging unit 30. In this super-resolution processing, for example, a processing region of multiple (here, two) images is used, a position at which an image (i.e., the processing region) accurately overlaps with the position of the fiducial mark 25 is obtained, motion estimation processing, registration processing, and the like are performed, and a temporary high-resolution image is generated. Then, blur estimation processing and reconstruction processing are performed on the temporary image, and an image having a higher resolution than the captured image is generated. super-resolution processing may be performed by the image processing section 34. By shifting low resolution images within a range of less than one pixel and superimposing the captured images, information between pixels can be further increased. In addition, since actual captured images are used, a super resolution image SR with high reliability can be generated as compared with an image in which information between pixels is interpolated by estimation. As described above, the mounting device 11 mounts from a relatively small chip component to a relatively large component. Generally, when a high-resolution image is to be captured, the imaging range (i.e., visual field) of the imaging unit 30 is narrowed and large-sized components cannot be captured, and when a large-sized component is to be captured, the resolution of small components is insufficient. In the mounting device 11, it is possible to sufficiently secure an imaging range when capturing an image of a large-sized component, and to sufficiently secure image resolution when capturing an image of a small-sized component or a small portion (a characteristic section such as a bump 61) by super-resolution processing.

When a super resolution image SR is generated in this manner, the CPU 41 performs precise positioning for determining the precise position of the component 60 and checking of shapes of the bumps 61 and the like in the super resolution image SR (S430). The precise position can be obtained, for example, as a difference between the X-axis and Y-axis coordinate values of the center position of the component 60 and the center position of the suction nozzle 24. The component shape can be confirmed, for example, by matching the captured image with a reference image and considering the degree of matching of a defect or deformation of a bump 61. When the CPU 41 determines that the component to be processed is to be skipped in S400, processing of S410-S430 is skipped and component suction error information is registered in association with the suction nozzles 24 (any one of 24a-24d) that did not suck the component (S440). As described above, since the presence or absence of the suction of the component 60 is determined in combination with setting the processing region for super-resolution processing from the mark image LR11, super-resolution processing can be omitted for the component 60 that is not sucked. Therefore, it is possible to prevent unnecessary super-resolution processing from being performed.

Then, the CPU 41 determines whether or not the processing of each component sucked by the suction nozzles 24 (24a-24d) has been completed (S450), and if the CPU 41 determines that processing of a component has not been completed, returns to S400 to perform processing of the next target component. When the CPU 41 determines that processing of each component is completed, CPU 41 ends the image processing routine. If it is determined in S390 that now is not the time to start processing of the component images LR12 and LR22, the CPU 41 skips processing of S400-S450 and terminates the image processing routine.

Returning to the description of the mounting process routine of FIG. 4. In the mounting process routine, the CPU 41 waits to obtain the result of the image processing (S220). When processing of S430 or S440 of the image processing routine shown in FIG. 6 is performed on each component sucked by the suction nozzles 24 (24a-24d) and the image processing routine is finished, the CPU 41 makes an affirmative determination in S220. When image processing using the image captured in the process of S150 is completed, the CPU 41 makes an affirmative determination in S220. When the result of image processing is obtained, the CPU 41 determines whether the positional deviation amounts and the component shapes based on the result of the image processing (e.g., the precise position of the component 60) are within permissible ranges (S230). Permissible ranges are set to empirically obtained ranges, for example, a range of positional deviation amounts in which a component can be properly arranged on the board S, or a range of shapes in which characteristics of the component are not impaired. When the CPU 41 determines that the positional deviation amount and the component shape of the component sucked by the mounting head 22 are within permissible ranges, the CPU 41 executes a process of mounting (i.e., arranging) the component at a position where the deviation amount is corrected (S240). On the other hand, when the amount of positional deviation of the component sucked by the mounting head 22 and the component shape are not within permissible ranges, the CPU 41 determines that the component 60 is a component in which a defect has occurred and performs a discard process (S250). When the component 60 sucked to any of the suction nozzles 24a-24d is an object of the discard process, the CPU 41 performs, for example, a process that includes subjecting the component 60 to a discard process and then mounting another normal component 60. When information of a component suction error is registered in association with any of the suction nozzles 24a-24d, the CPU 41 performs the mounting process of S240 on boards except for the component corresponding to the suction nozzle 24 of the component suction error. The CPU 41 can also transmit, to the management PC 50, information on the component suction error or information indicating that the component has been subjected to a discard process.

When the CPU 41 executes the process of S240 or S250, it determines whether or not the mounting process of the current board S has been completed (S260), and when it determines that the mounting process of the current board S has not been completed, it executes S120 and subsequent processes. That is, the CPU 41 sets a component to be sucked next, and after sucking the component, images are captured by the imaging unit 30 as needed, and super-resolution processing is performed to determine the positional deviation and the shape of the sucked component. On the other hand, when the CPU 41 determines that the mounting process of the current board S has been completed in S260, it ejects the board S for which the mounting process has been completed (S270) and determines whether or not the manufacturing of the board S has been completed (S280). When the CPU 41 determines that manufacturing of the board S is not completed, the process after S110 is executed. That is, the CPU 41 carries in a new board S and executes processing after S120. On the other hand, when the CPU 41 determines in S280 that the manufacturing of the board S is completed, the mounting process routine ends.

Here, the corresponding relationship between constituent elements of the present embodiment and constituent elements of the present disclosure will be clarified. The suction nozzle 24 of the present embodiment corresponds to a holding member of the present disclosure, the fiducial mark 25 corresponds to a fiducial mark, the mounting head 22 corresponds to a head, the imaging unit 30 corresponds to an imaging device, and the control device 40 corresponds to a control device. In the present embodiment, an example of the imaging processing method of the present disclosure is also clarified by describing the operation of the Mounting device 11.

The mounting device 11 according to the embodiment described above sets the processing region to be subjected to super-resolution processing based on the approximate position of the main body portion of the component 60 included in the mark image and performs super-resolution processing. This prevents the processing area of super-resolution processing from becoming larger than necessary with respect to the main body portion of the component 60, thus allowing the processing region to be appropriately set. Further, since the processing region for super-resolution processing is determined using the mark image captured under an imaging condition different from that of the component image used in super-resolution processing, the processing region can be appropriately set while the component image is kept under an imaging condition suitable for super-resolution processing. Therefore, the super-resolution processing can be efficiently performed.

Further, the mounting device 11 captures the mark image LR11 and the component image LR12 at the first position within the imaging range in this order, then captures the mark image LR21 and the component image LR22 at the second position within the imaging range in this order, and sets the processing region of super-resolution processing using the mark image LR11. For this reason, the processing region of the super-resolution processing is set in parallel while the images required for super-resolution processing (i.e., the component image LR12, the marked image LR21, and the component image LR22) are being captured so that the time required for super-resolution processing does not increase. Further, when the approximate position cannot be detected from the mark-image LR11, since super-resolution processing is not executed as if a suction error of the component 60 had occurred, super-resolution processing can be prevented from being unnecessarily performed.

It is to be understood that the present disclosure is not limited to the above-described embodiments, and may be implemented in various modes as long as they fall within the technical scope of the present disclosure.

Figure 9:
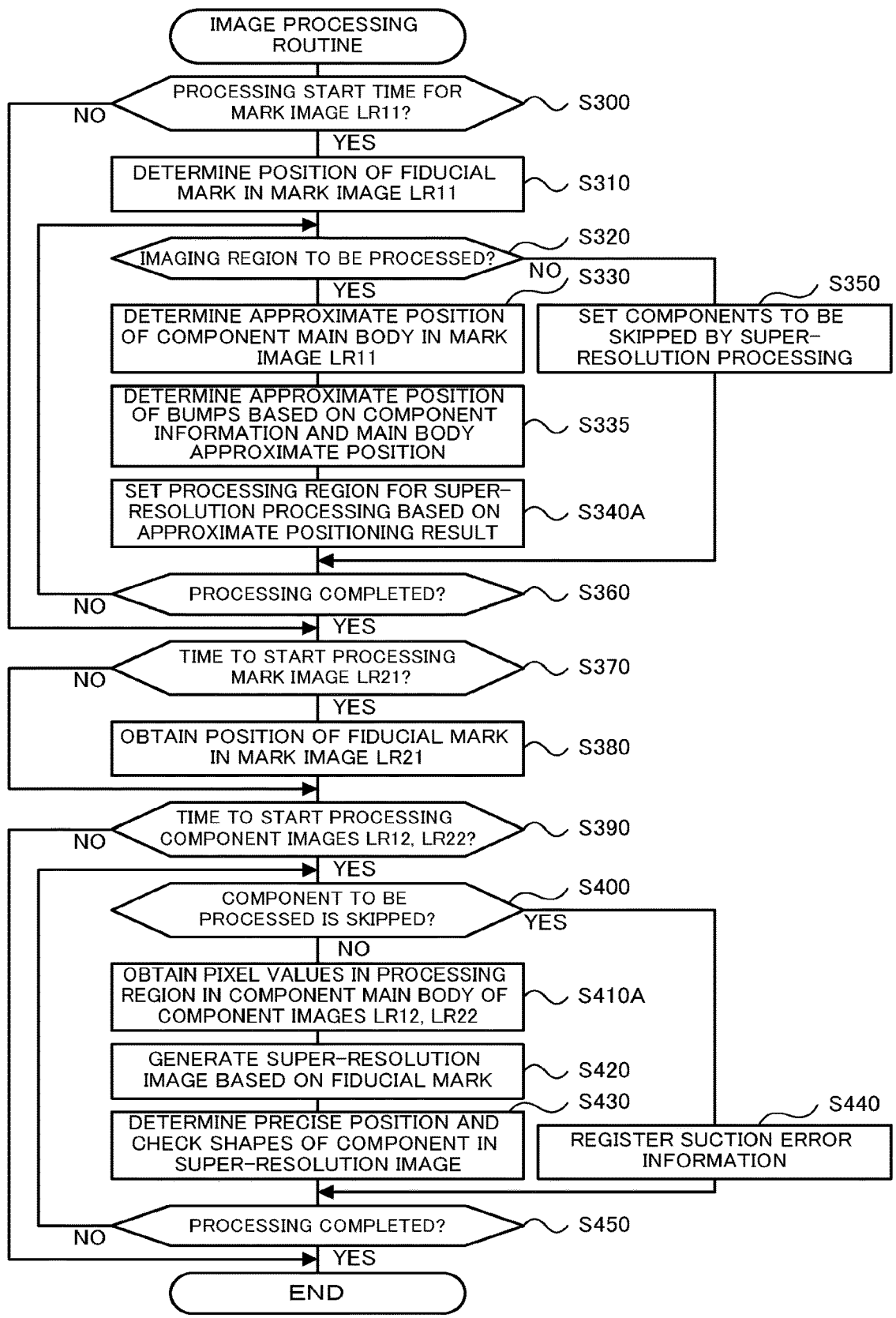
FIG. 9 is a flowchart showing an image processing routine according to an alternative embodiment.

For example, in the embodiment described above, although the processing region for super-resolution processing is set based on the approximate position of the main body portion of the component 60, the present disclosure is not limited to this, and the processing region may be set based on the approximate position of the component 60 obtained based on the image region of the component 60. For example, if the lead terminal (i.e., the electrode) protrudes to the side of the component 60, the processing region may be set based on the approximate position of the outer shape of the component 60 that includes the lead terminal. Further, as described below, the processing region may be set for only a portion of the bump 61 (electrode). FIG. 9 is a flowchart showing an image processing routine of an alternative embodiment. In the image processing routine of FIG. 9, the same processing as that of the image processing routine of FIG. 6 is performed except for one part, and therefore description of the same processing is omitted.

Figure 10:
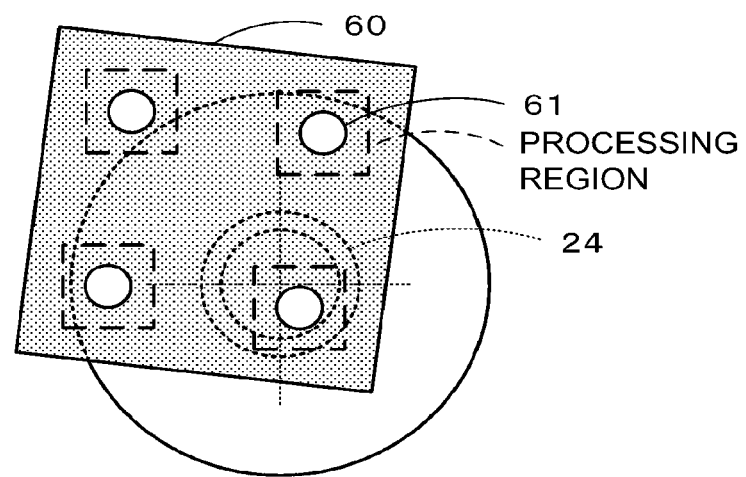
FIG. 10 is an explanatory diagram illustrating a processing region of an alternative embodiment.

In the image processing routine of the alternative embodiment of FIG. 9, when approximate positioning of the main body portion of the component is performed in S330, the CPU 41 performs approximate positioning of the bumps 61 (i.e., the electrodes) based on the component information obtained in S120 of the mounting process routine of FIG. 4 and the approximate position of the main body portion (S335). Here, as described above, the component information obtained from the mounting job information includes information on the position and size of the electrodes of the bumps 61 (i.e., bump diameter, etc.) and the like. Therefore, the CPU 41 can designate a reference position of the main body portion from the approximate position of the main body portion (e.g., the center position) and determine the approximate position of the bumps 61 based on the reference position. The CPU 41 determines multiple (here, four) approximate positions of bumps 61 with respect to one component 60. In addition, the CPU 41 sets the area of each bump 61 in the component 60 to the processing region for super-resolution processing based on the approximate positioning result of each bump 61 (S340a). The CPU 41 sets rectangular regions corresponding to the size of the bumps 61 (i.e., the bump diameters) its the processing area of super-resolution processing with the approximate position of each bump 61 as the center. FIG. 10 is an explanatory diagram showing a processing region for super-resolution processing of the alternative embodiment. As shown in the figure, four processing regions corresponding to the bumps 61 are set in the component 60. Then, when the processing of S360-S400 is performed, the CPU 41 obtains the pixel values in each processing region in the main body portion of the component of the component images LR12, LR22 (S410a), and performs super-resolution processing on each processing region in S420 to generate a super resolution image SR.

As described above, in the alternative embodiment, the processing region for super-resolution processing is set based on the approximate position of the bumps 61 (electrodes) of the component 60. Therefore, since the processing region of the super-resolution processing can be limited to a smaller region, super-resolution processing is more efficient and generation of the super resolution image SR can be further accelerated. Here, in this alternative embodiment, the super resolution image is generated only in the processing region in the main body portion of the component 60 (i.e., the region of the bump 61 and the region in the vicinity thereof), but the image of the entire component 60 may be generated by setting pixel values in a region other than the processing region in the main body portion and synthesizing the image with the super resolution image. For example, an image of the component 60 may be generated by synthesizing the image with the super resolution image of the bump 61 using a predetermined fixed value (e.g., value 0) as a pixel value of a region other than the processing region in the main body portion. Alternatively, the image of the component 60 may be generated by synthesizing the image with the super resolution image of the bump 61 with values obtained by interpolating the pixel values of the component images LR12, LR22 with bilinear interpolation, bicubic interpolation, or the like and of the region other than the process region. In this way, when the result of the image processing of the super resolution image is displayed on the display section (i.e., the display unit (not shown) of the mounting device 11, the display 54 of the management PC 50, etc.), not only the super resolution image of a part of the component 60 but also the entire image of the component 60 including the super resolution image can be displayed.

Figure 11:
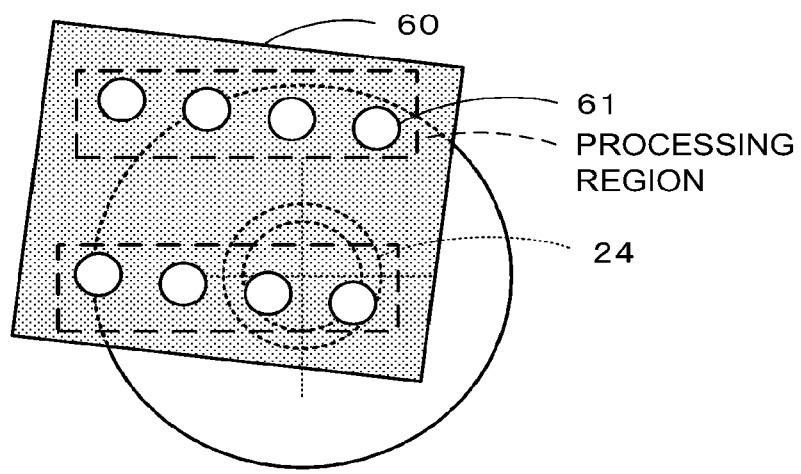
FIG. 11 is an explanatory diagram illustrating a processing region of an alternative embodiment.

In this alternative embodiment, the processing region for super-resolution processing is set for each bump 61 of the component 60, but the present disclosure is not limited to this. FIG. 11 is an explanatory diagram showing a processing region for super-resolution processing of the alternative embodiment. As shown in the figure, the region of the bump group that includes multiple bumps 61 is set as the processing region for super-resolution processing. Here, the CPU 41 may be one in which a processing region including one bump 61 is set when the interval between adjacent bumps 61 (bump pitch) is equal to or greater than a predetermined interval, and a processing region including multiple bumps 61 is set when the interval between adjacent bumps 61 is less than a predetermined interval. In this manner, the CPU 41 can set the processing region for super-resolution processing for each bump group (electrode group). In this way, if the processing region for super-resolution processing is set for each bump 61, it is possible to appropriately prevent deterioration of processing efficiency, such as a case in which super-resolution processing is performed on overlapped regions due to overlapping that occurs in the processing region due to a narrow interval between the bumps 61.

In the embodiment described above, the component image LR12, the mark image LR21, and the component image LR22 are captured in parallel with the process of setting the processing region for super-resolution processing from the mark image LR11. That is, although the setting of the processing region for super-resolution processing and imaging are performed in parallel, the present disclosure is not limited to this. The CPU 41 of the control device 40 may set the processing region for super-resolution processing after capturing images required for super-resolution processing is completed. From the viewpoint of shortening the processing time of super-resolution processing, having the CPU 41 set the processing region for super-resolution processing and capture images in parallel is preferable.

In the embodiment described above, the super resolution image SR is generated based on the images captured at the first position and the second position, but the present disclosure is not limited to this. The super resolution image SR may be generated based on the images captured at three or more positions, such as the third position and the fourth position.

Although the holding member is described as the suction nozzle 24 in the above-described embodiment, the present disclosure is not limited to this as long as the holding member holds a component. For example, a mechanical chuck or the like that mechanically clamps and holds the component may be used.

INDUSTRIAL APPLICABILITY

The present disclosure can be applied to a device that performs a mounting process for positioning a component on a board.

REFERENCE SIGNS LIST

10 Mounting system, 11 mounting device, 12 board conveyance unit, 13 mounting unit, 14 component supply unit, 20 head moving section, 22 mounting head, 23 Z-axis motor, 24, 24a-24d suction nozzles, 25 fiducial mark, 30 imaging unit, 31 lighting section, 32 Lighting control section, 33 imaging device, 34 image processing section, 40 control device, 41 CPU, 42 ROM, 43 HDD, 44 RAM, 45 input and output interface, 46 bus, 50 management computer, 52 input device, 54 display, 60 components, 61 bumps, LR11, LR21 mark image, LR12, LR22 component image, S board.

The invention claimed is:

1. A mounting device which obtains a holding state of an electronic component by super-resolution processing in which a high-resolution image of the electronic component is generated using multiple low-resolution images based on a fiducial mark, and mounts the electronic component on a board, the mounting device comprising:
 a head including the fiducial mark and at least one suction nozzle configured to hold the electronic component;
 an imaging device of which including an imaging range above the imaging device that covers the electronic component held by the at least one suction nozzle and the fiducial mark; and
 a control device that controls the imaging device in such a manner that a mark image for use in obtaining a position of the fiducial mark and low-resolution images for use in the super-resolution processing are captured under different imaging conditions, the control device setting a processing region as a target of the super-resolution processing based on an image region of the electronic component included in the mark image;
 wherein the head includes a bottom surface, and a plurality of the suction nozzles and the fiducial mark face downward from the bottom surface.

2. The mounting device according to claim 1, wherein the holding state including a precise position of the electronic component is obtained from the high-resolution image by the super-resolution processing, and the control device obtains an approximate position of the electronic component based on the image region of the electronic component included in the mark image, and sets the processing region based on the obtained approximate position of the electronic component.

3. The mounting device according to claim 2, wherein the control device obtains an approximate position of a main body portion of the electronic component as the approximate position of the electronic component and sets the processing region based on the obtained approximate position of the main body portion.

4. The mounting device according to claim 3, wherein the control device obtains component information defining a position of an electrode with respect to the main body portion of the electronic component, derives an approximate position of the electrode based on the obtained component information and the approximate position of the main body portion, and sets the processing region based on the derived approximate position of the electrode.

5. The mounting device according to claim 1, wherein the control device controls the imaging device in such a manner that the imaging device captures the mark image and low-resolution images for use in the super-resolution processing in this order when the head is positioned at a first position within the imaging range, and the imaging device captures the mark image and low-resolution images for use in the super-resolution processing when the head is positioned at a second position different from the first position within the imaging range, and the control device sets the processing region using the mark image captured at the first position.

6. The mounting device according to claim 1, further comprising:

a head moving section including a slider that moves the head.

7. The mounting device according to claim 1, wherein the head includes a plurality of the suction nozzles arranged around the fiducial mark.

8. An imaging processing method for performing super-resolution processing to generate a high-resolution image of an electronic component using multiple low-resolution images based on a fiducial mark, the imaging processing method comprising:

mounting the electronic component on a head that includes the fiducial mark and at least one suction nozzle configured to hold the electronic component;

capturing from below, under different imaging conditions, a mark image for use in obtaining a position of the fiducial mark and the low-resolution images for use in the superresolution processing, the mark image including the fiducial mark and the electronic component held by the at least one suction nozzle; and setting a processing region as a target of the super-resolution processing based on an image region of the electronic component included in the mark image;

wherein the head includes a bottom surface, and a plurality of the suction nozzles and the fiducial mark face downward from the bottom surface.

9. The imaging processing method according to claim 8, wherein the mark image is captured before a low-resolution image for use in generating the high-resolution image are captured, and the low-resolution image for use in the super-resolution processing are captured in parallel with the setting of the processing region.

* * * * *